United States Patent
Kashiwa et al.

(10) Patent No.: US 11,959,162 B2
(45) Date of Patent: Apr. 16, 2024

(54) GAS BARRIER LAMINATED BODY

(71) Applicant: TOYOBO CO., LTD., Osaka (JP)

(72) Inventors: Mitsuhiro Kashiwa, Otsu (JP); Yukihiro Numata, Otsu (JP); Kiyoshi Iseki, Otsu (JP)

(73) Assignee: TOYOBO CO., LTD., Osaka (JP)

( * ) Notice: Subject to any disclaimer, the term of this patent is extended or adjusted under 35 U.S.C. 154(b) by 1084 days.

(21) Appl. No.: 16/637,526

(22) PCT Filed: Jul. 26, 2018

(86) PCT No.: PCT/JP2018/028077
§ 371 (c)(1),
(2) Date: Feb. 7, 2020

(87) PCT Pub. No.: WO2019/031263
PCT Pub. Date: Feb. 14, 2019

(65) Prior Publication Data
US 2020/0224304 A1    Jul. 16, 2020

(30) Foreign Application Priority Data

Aug. 10, 2017 (JP) ................................ 2017-155059

(51) Int. Cl.
| | | |
|---|---|---|
| *C23C 14/08* | (2006.01) | |
| *B65D 65/22* | (2006.01) | |
| *B65D 65/38* | (2006.01) | |
| *B65D 65/42* | (2006.01) | |

(52) U.S. Cl.
CPC ............. *C23C 14/08* (2013.01); *B65D 65/22* (2013.01); *B65D 65/42* (2013.01); *B65D 2565/387* (2013.01); *B65D 2585/86* (2013.01)

(58) Field of Classification Search
CPC ... C32C 14/08; C32C 14/0021; C32C 14/243; C32C 14/30; C32C 14/562; C32C 14/081; C32C 14/0682; C32C 14/0617; C32C 14/10; B65D 65/22; B65D 65/42; B65D 2565/387; B65D 2585/86; C08J 2367/02; B23B 9/00
See application file for complete search history.

(56) References Cited

U.S. PATENT DOCUMENTS 5,725,958 A * 3/1998 Matsuda ................. C23C 14/10
428/458
2006/0251905 A1* 11/2006 Arakawa ................. C08J 7/048
428/429

FOREIGN PATENT DOCUMENTS

| | | |
|---|---|---|
| JP | H05-179033 A | 7/1993 |
| JP | H06-001379 A | 1/1994 |
| JP | H07-242760   * | 9/1995 |
| JP | H07-242760 A1 | 9/1995 |
| JP | H09-241829 A | 9/1997 |
| JP | 2005-131860 A | 5/2005 |
| JP | 2005-131861 A | 5/2005 |
| JP | 2005-138537 A | 6/2005 |
| JP | 2006-289627 A | 10/2006 |
| JP | 2017-134371 A | 8/2017 |

OTHER PUBLICATIONS

Korean Intellectual Property Office, Office Action in Korean Patent Application No. 10-2020-7006501 (dated Mar. 20, 2023).
Indian Patent Office, Examination Report in Indian Patent Application No. 202047008544 (dated Jul. 12, 2021).
Japanese Patent Office, International Search Report in International Patent Application No. PCT/JP2018/028077 (dated Sep. 18, 2018).
Japanese Patent Office, International Preliminary Report on Patentability in International Patent Application No. PCT/JP2018/028077 (dated Feb. 20, 2020).
China National Intellectual Property Administration, The First Office Action in Chinese Patent Application No. 201880051005.3 (dated Apr. 6, 2021).
European Patent Office, Extended European Search Report in European Patent Application No. 18844583.7 (dated Apr. 23, 2021).
European Patent Office, Communication Pursuant to Article 94(3) in European Patent Application No. 18844583.7 (Feb. 28, 2024).

* cited by examiner

*Primary Examiner* — K. Boyle
(74) *Attorney, Agent, or Firm* — Leydig, Voit & Mayer, Ltd.

(57) ABSTRACT

An object to be achieved by the present invention is to provide a gas barrier film having excellent acid resistance, transparency, and gas barrier properties. The gas barrier laminated body of the present invention is a laminate, in which an inorganic thin-film layer is laminated onto at least one of surfaces of a polymer substrate, and the inorganic thin-film layer mainly contains Al and Si, and a ratio of an Al content amount between before and after treatment of immersing the laminate into aqueous solution of hydrochloric acid that has concentration of 1 mol/L for one hour satisfies a formula of (Al Content Amount After Treatment)/(Al Content Amount Before Treatment)×100≥75.

1 Claim, 1 Drawing Sheet

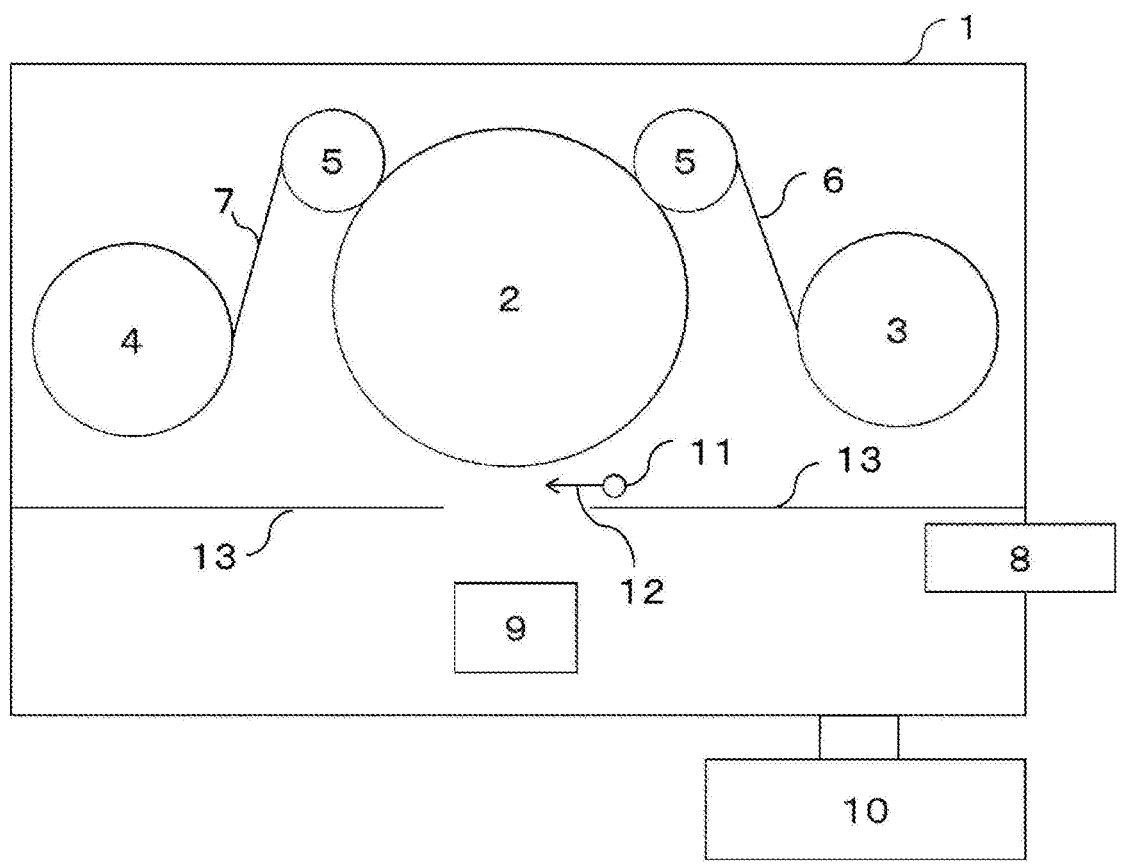

GAS BARRIER LAMINATED BODY

CROSS-REFERENCE TO RELATED APPLICATIONS

This patent application is the U.S. national phase of International Patent Application No. PCT/JP2018/028077, filed Jul. 26, 2018, which claims the benefit of Japanese Patent Application No. 2017-155059, filed on Aug. 10, 2017, which are incorporated by reference in their entireties herein.

TECHNICAL FIELD

The present invention relates to a gas barrier laminated body which has excellent acid resistance and gas barrier properties, and is preferably used for food packaging and for packaging of electronic components and the like.

BACKGROUND ART

Recently, packaging materials to be used for food, pharmaceutical products, electronic components and the like have been required to prevent penetration of gas such as oxygen and water vapor so as to inhibit oxidation, deterioration, corrosion and the like of their contents, so that a packaging material having gas barrier properties for blocking these kinds of gas has been sought.

As a film having excellent gas barrier properties, a plastic film with aluminum (hereinafter, called as Al) laminated thereto and a plastic film coated with vinylidene chloride or ethylene-vinyl alcohol copolymer have been known. Further, as a film utilizing an inorganic thin-film, a film with a thin-film of silicon oxide, aluminum oxide or the like laminated thereto has been known.

The above-described conventional gas barrier films have had following problems. Although the aluminum laminate is economically superior and has excellent gas barrier properties, it is opaque so as not to allow the packaged content of the aluminum laminate to be seen through, and does not allow microwaves to permeate through and thus cannot be used in a microwave oven. Also, if aluminum is contained in a part of configurations of such packaging materials and packages, the plastic films have a problem that they cannot be recovered and recycled. The film coated with vinylidene chloride or ethylene-vinyl alcohol copolymer has insufficient gas barrier properties of water vapor, oxygen or the like, and the degradation is considerable particularly in a high temperature process such as a boiling process and a retorting process. Further, vinylidene chlorides generate chlorine gas during incineration, so that the influence on global environment is also concerned.

In order to overcome these problems, a transparent vapor-deposition film obtained by forming a ceramic thin-film onto a substrate made of a transparent polymer material by a method such as a vacuum vapor-deposition method has been released recently.

As a material for this ceramic thin-film, silicon oxide such as silicon monoxide and aluminum oxide (hereinafter, called as $Al_2O_3$) are often used. However, silicon oxide which exhibits favorable gas barrier properties is colored in slight brown, and is insufficient as a transparent gas barrier film. Further, an evaporating temperature of a raw material of $Al_2O_3$ is high, so that the evaporation speed in a vapor-deposition process becomes low. Thus, for adhering a thin-film thickness sufficient for providing the required gas barrier properties, a thin-film formation time becomes long, and production efficiency becomes low, thereby increasing the cost.

In order to solve these problems, in Patent Document 1, $Al_2O_3$ and silicon oxide are mixed so as to form a thin-film of complex oxide, whereby a film having excellent transparency can be formed in a comparatively short thin-film formation time.

However, the inventors of the present invention have found that a gas barrier film formed by this method has a problem that an inorganic thin-film layer is dissolved by being immersed into acid solution.

PRIOR ART DOCUMENTS

Patent Document

Patent Document 1: JP-A-7-242760

SUMMARY OF THE INVENTION

Problems to Be Solved By the Invention

The present invention aims to provide a laminate which has excellent acid resistance and gas barrier properties, and can be used for a packaging bag for acid food or for packaging of electronic components that are weak against acid and the like.

Means for Solving the Problems

As a result of keen study with regard to the problem of this conventional art, the inventors have found that, by adjusting vapor-deposition conditions including a heating ratio of vapor-deposition materials and the vapor-deposition method, a laminate having high acid resistance, high gas barrier properties, and transparency can be formed.

As a result of the keen study, the inventors have found that the above-described problems can be solved by below-described means, thereby reaching the present invention. That is, the present invention includes following configurations.

1. A gas barrier laminated body, comprising a polymer substrate and an inorganic thin-film layer laminated onto at least one surface of the polymer substrate, wherein the inorganic thin-film layer mainly contains Al and Si, and a ratio of an Al content amount in the inorganic thin-film layer between before and after treatment of immersing the laminate into aqueous solution of hydrochloric acid that has concentration of 1 mol/L for one hour, satisfies following Formula 1:

(Al Content Amount After Treatment)/(Al Content Amount Before Treatment)×100≥75  (Formula 1).

2. The gas barrier laminated body according to 1 above, wherein the inorganic thin-film layer is a vapor-deposited thin-film layer that is made of composite oxide containing Al and Si.

Effect of the Invention

In the present invention, by adjusting vapor-deposition conditions including a heating quantity ratio of Al and $SiO_2$ and the vapor-deposition method, a laminate having excellent acid resistance, gas barrier properties, and transparency can be provided.

BRIEF DESCRIPTION OF THE DRAWINGS

FIG. 1 is a view illustrating a vacuum vapor-deposition device that is used for production in Examples 1 and 2 of the present invention.

MODE FOR CARRYING OUT THE INVENTION

The present invention will be described below in detail.

A gas barrier laminated body of the present invention is a gas barrier laminated body, in which an inorganic thin-film layer is laminated onto at least one of surfaces of a polymer substrate, in which the inorganic thin-film layer mainly contains Al and Si, and a ratio of an Al content amount in the inorganic thin-film layer between before and after treatment of immersing the laminate into aqueous solution of hydrochloric acid that has concentration of 1 mol/L for one hour satisfies following Formula 1:

(Al Content Amount After Treatment)/(Al Content Amount Before Treatment)×100≥75     (Formula 1).

Preferably, the relation of (Al Content Amount After Treatment)/(Al Content Amount Before Treatment)×100≥80 is satisfied.

The inorganic thin-film layer is preferably a vapor-deposited thin-film layer that is made of composite oxide containing Al and Si.

It is considered that, by immersing the inorganic thin-film layer into the aqueous solution of hydrochloric acid, the inorganic matters are dissolved into the acid. That is, Formula 1 represents resistance of the inorganic thin-film layer against the acid. It is well known that Al exhibits resistance against acid by forming an oxide coating film on the surface of Al. However, in the case of forming a thin-film of a composite compound with silicon oxide, the reaction of Al with oxygen is inhibited by the silicon oxide, whereby an oxide coating film cannot be sometimes formed successfully. As a result, Al is exposed and thus is likely to be dissolved into the acid, so that the resistance against the acid is considered to be deteriorated. As described above, in the case where the resistance against acid is deteriorated, Formula 1 cannot be satisfied.

As gas barrier properties of the laminate of the present invention, an oxygen permeation amount under the environment at a temperature of 23° C. and relative humidity of 65% RH is preferably 1.0 ml/m²/24H/MPa or more and 100 ml/m²/24H/MPa or less. It is less preferable that the gas barrier properties are more than 100 ml/m²/24H/MPa, because such a laminate is hard to be used for food, pharmaceutical products, industrial products and the like. Further, although the lower the gas barrier properties are, the better, a lower limit of the barrier properties in the present configuration is 1.0 ml/m²/24H/MPa according to the current technical level, and even gas barrier properties of 1.0 ml/m²/24H/MPa are practically sufficient. A more preferable range thereof is 1.0 ml/m²/24H/MPa or more and 70 ml/m²/24H/MPa or less, and a particularly preferable range is 1.0 ml/m²/24H/MPa or more and 30 ml/m²/24H/MPa or less.

Hereinafter, materials to compose the laminate of the present invention and a production method thereof will be described.

A polymer substrate in the present invention is a film-shaped substrate which is obtained by melt-extruding organic polymer, stretching the organic polymer in a longitudinal direction and/or a transverse direction as necessary, and cooling and thermosetting the organic polymer. As the organic polymer, polyethylene, polypropylene, polyethylene terephthalate, polybutylene terephthalate, polyethylene-2,6-naphthalate, nylon 6, nylon 4, nylon 66, nylon 12, polyvinyl chloride, polyvinylidene chloride, polyvinyl alcohol, wholly aromatic polyamide, polyamide imide, polyimide, polyether imide, polysulfone, polyphenylene sulfide, polyphenylene oxide, and the like can be exemplified. Among the above organic polymers, in the light of low thermal shrinkage and low moisture absorbing expansibility, polyethylene terephthalate is preferable. Also, these kinds of organic polymer may be copolymerized or blended with a small amount of other kind of organic polymer.

Further, to this organic polymer, publicly known additives such as, for example, a ultraviolet absorber, an anti-static agent, a plasticizer, a lubricant and a coloring agent may be added, and then, transparency of the organic polymer is not limited particularly, but if the organic polymer is used as a transparent gas barrier film, the total light transmittance in the laminate is 50% or more, is preferably 70% or more, and is further preferably 85% or more.

As the polymer substrate of the present invention, the film may be subjected to corona discharge treatment, glow discharge treatment or other surface roughening treatment, and may also be subjected to anchor coat treatment, or may be printed or decorated before laminating a thin-film layer thereto, as far as not losing the object of the present invention.

The polymer substrate of the present invention has a thickness that preferably ranges from 5 µm to 200 µm, more preferably ranges from 8 µm to 50 µm, and particularly preferably ranges from 10 µm to 30 µm.

Further, the substrate layer in the present invention may be a laminated film of two layers or more. In the case of adopting as a laminated film, a kind, the number of layers of lamination, a lamination method and the like of the laminate are not limited particularly, and may be selected arbitrarily from publicly known methods according to the purpose.

The inorganic thin-film layer in the present invention contains Al and Si as elements, and a ratio of Al and Si varies according to formation conditions. In these components, a slight amount (3% or smaller with respect to total components) of other component may be contained to an extent that does not lose the properties. A thickness of the inorganic thin-film is preferably 5 nm to 100 nm, and is further preferably 7 nm to 40 nm, in the light of the gas barrier properties and flexibility.

For forming the inorganic thin-film layer, a vacuum vapor-deposition method is adopted. In the present invention, Al and $SiO_2$ are used as vapor-deposition material sources, and beside Al and $SiO_2$, silicon monoxide (SiO), aluminum oxide ($Al_2O_3$) and the like may be mixed. Al can be transformed also into oxide such as AlO and $Al_2O_3$ by oxidation. $SiO_2$ can be transformed into silicon or silicon oxide such as SiO or Si by reduction.

Further, respective particles are required to have an appropriate size so as not to change pressure during the vapor-deposition. A range of the particle size is preferably 3 mm or larger and 20 mm or smaller, and is further preferably 3 mm or larger and 10 mm or smaller. If the particle diameter is too large, evaporation takes time from start of heat application, whereby change of pressure becomes larger. On the other hand, if the particle diameter is too small, explosive boil is caused, and the particles are attached to the film, whereby degradation in quality of appearance may be caused, or flaws may be generated to the thin-film.

The respective vapor-deposition materials are partitioned by a crucible in a hearth. Since Al has high thermal conductance, heat conducts between Al particles quicker than the temperature of Al particles reaching an evaporating temperature, whereby the temperature is increased to the evaporating temperature after liquefying all of the Al particles. Thus, if the materials are divided just by the partition plate, liquid Al may flow through a gap or the like. By partitioning the materials by the crucible, it is possible not only to decrease thermal dispersion so as to increase heating efficiency, but also to inhibit outflow of the liquid Al. A kind of the crucible is not limited particularly, but for example, a crucible that is mainly made of $Al_2O_3$ is preferable, and a crucible which is mainly made of $Al_2O_3$ and has holes is further preferable, in the light of heat resistance and thermal insulation.

A weight ratio of Al atoms:Si atoms is preferably within a range from 10:90 to 50:50, and is further preferably within a range from 20:80 to 40:60. If the Al ratio is too low, the gas barrier properties are not exhibited, and the Al ratio is too high, the thin-film is likely to be colored, so that the application as the transparent gas barrier film is limited.

As a heating method, an electron gun heating method is preferable, because it has a merit that a heating quantity change quickly responds to a change of scanning and a current value, but the heating method is not limited to this method, and resistance heating, high frequency induction heating, laser heating and the like can also be adopted. Further, reactive gas can be introduced into a thin-film formation apparatus. In this case, the reactive gas to be introduced is preferably transformed into plasma. As the reactive gas, oxygen gas is used, and beside the oxygen gas, nitrogen, hydrogen, water vapor or the like may be introduced, and means such as ozone addition and ion assist may also be adopted thereto.

An introduction mount of the oxygen gas is not limited particularly, because it is changed according to the evaporation amount of the vapor-deposition materials, but it is preferably adjusted so that pressure in the vacuum chamber 1 during the thin-film formation may be $5.0 \times 10^{-1}$ Pa or lower, and further preferably, the pressure may be $1.0 \times 10^{-1}$ Pa or lower.

An emission current of the electron gun is preferably 0.3 A or higher and 1.5 A or lower, is further preferably 0.3 A or higher and 1.0 A or lower, and is more preferably 0.3 A or higher and 0.8 A or lower. If the emission current is lower than 0.3 A, sufficient evaporation speed cannot be obtained, thereby decreasing the productivity. On the other hand, if the emission current is too high, decomposition of silicon oxide becomes large, whereby control of the pressure becomes difficult.

The electron gun can heat the respective materials by time division. In a heating ratio by the time division, if a heating quantity time ratio of Al is denoted by a, and a heating quantity time ratio of $SiO_2$ is denoted by b, preferably the relation of a<b and 2a>b is satisfied. More preferably, the relation of a<b and 1.5a≥b is satisfied. If the vapor-deposition is carried out in the condition of a>b, the thin-film is likely to be colored, but in the condition of 2a<b, an evaporation amount of $SiO_2$ becomes excessive, and thus vapor-deposited particles are considered to inhibit a reaction between Al and oxygen gas.

FIG. 1 illustrates the vacuum vapor-deposition apparatus of the present invention. In a vacuum chamber 1, an unwinding portion 3 and a winding portion 4 are disposed via a cooling drum 2 and guide rolls 5. The two guide rolls are illustrated, but the number of the guide rolls is not limited to this.

The reactive gas is introduced into the vacuum chamber 1 using a pipe 11. A shape of the pipe and the gas introduction position of the pipe are not limited particularly, but in the light of the reactivity, it is preferable to dispose the pipe so that the gas may be supplied between a crucible 9 in which the vapor-deposition material is disposed and the cooling drum 2 on which the substrate runs, as shown by a reactive gas introduction direction 12. Further, the pipe 11 is preferably covered with an attachment prevention plate 13 so that the vapor-deposition materials may not be attached thereto.

In the present invention, the thin-film may be formed only on one of surfaces of the plastic film, but may be formed on both of the surfaces. Further, the formation conditions may be changed by adding a bias to the substrate or the like, as far as not losing the object of the present invention.

The gas barrier laminated body of the present invention may be used as it is, and may also be used after being laminated or coated with a film or a thin layer of other organic polymer.

For example, in the case of using the gas barrier laminated body of the present invention for packaging, it may be laminated with various kinds of films or paper depending on properties required for a content to be packaged, and as a representative laminate configuration thereof, the gas barrier film (on PET)/PE, the gas barrier film (on PET)/CPP, NY/the gas barrier film (on PET)/PE, the gas barrier film (on NY)/PE and the like can be considered. A lamination method thereof is not limited particularly, but dry lamination, an extrusion lamination method and the like are preferable. Further, decoration and printing for content description may be added thereto, or a design film, a reinforcing material and the like may be adhered thereto.

EXAMPLES

The present invention will be specifically described below by way of examples, but the present invention is not limited to the examples.

Hereinafter, measurements and operating procedures carried out in the examples will be described.

1) Calculation of Thin-Film Thickness and Ratio of Al and Si

A thin-film thicknesses and a ratio of Al and Si were measured by using an X-ray fluorescence spectrometer (System 3270 produced by Rigaku Corporation). X-rays were generated by a rhodium bulb at 50 kV and 50 mA, and a composite thin-film of $Al_2O_3/SiO_2$ was quantified using a calibration curve which was formed based on samples with different composition ratios.

2) Oxygen Permeability

Oxygen permeability of the formed gas barrier film was measured by an oxygen permeability measurement device (OX-TRAN100 produced by Modern Controls, Inc.) under conditions at 23° C. and 65% R.H.

4) Light Transmittance

Total light transmittance was measured by a hazemeter (hazemeter produced by NIPPON DENSHOKU INDUSTRIES CO., LTD, NDH5000).

5) Acid Resistance

A sample that was cut into a square of 50 mm×50 mm was immersed into aqueous solution of hydrochloric acid which was prepared to be 1 mol/L so that an inorganic thin-film layer might be on a liquid surface side, and was allowed to stand still for one hour. Thereafter, the sample was immersed into distilled water for 30 minutes, was washed with water and was dried by air, and a peak intensity of Al was subsequently measured by an X-ray fluorescence spectrometer so as to calculate a change of an Al content rate between before and after the immersion. A calculation formula was defined as (Al content amount after the immersion)/(Al content amount before the immersion)×100.

Example 1

A composite oxide thin-film was formed on a PET film (TOYOBO CO., LTD.: E5100) with a thickness of 12 μm by a vacuum vapor-deposition device shown in FIG. 1, using particulate Al (purity: 99.9%) of about 7 mm to about 9 mm and $SiO_2$ (purity: 99.9%) of about 4 mm to about 7 mm as vapor deposition sources. The above-described two kinds of the vapor-deposition materials were not mixed, but were partitioned by putting Al into a crucible which was made of $Al_2O_3$ and had holes and putting $SiO_2$ around the crucible in a hearth. One electron gun was used as a heat source so as to heat each of Al and $SiO_2$ by time division. An output of electron beams was 0.7 A, a heating ratio (time ratio) of Al and $SiO_2$ was 40:60, and feeding speed of the film was 200 m/min, thereby forming the composite thin-film with a thickness of 19.1 nm. A flow rate of oxygen gas was 100 sccm, and pressure during the vapor-deposition was 9.4× $10^{-2}$ Pa. Further, a temperature of a coating roll for cooling the film during the vapor-deposition was adjusted at −10° C., thereby obtaining the laminate of the present invention. These thin-film formation conditions will be shown in Table 1.

A thin-film thickness and a ratio of Al and Si of the thus obtained laminate were measured by an X-ray fluorescence spectrometer, oxygen permeability was measured as the gas barrier properties, and light transmittance was measured as an optical property by using the produced laminate. Further, acid resistance was evaluated.

Example 2

A composite oxide thin-film was formed on a PET film (TOYOBO CO., LTD.: E5100) with a thickness of 12 μm by a vacuum vapor-deposition device shown in FIG. 1, using particulate Al (purity: 99.9%) of about 7 mm to about 9 mm and $SiO_2$ (purity: 99.9%) of about 4 mm to about 7 mm as vapor deposition sources. The above-described two kinds of the vapor-deposition materials were not mixed, but were partitioned by putting Al into a crucible which was made of $Al_2O_3$ and had holes and putting $SiO_2$ around the crucible in a hearth. One electron gun was used as a heat source so as to heat each of Al and $SiO_2$ by time division. An output of electron beams was 0.6 A, a heating ratio (time ratio) of Al and $SiO_2$ was 49:51, and feeding speed of the film was 100 m/min, thereby forming the composite thin-film with a thickness of 36.4 nm. A flow rate of oxygen gas was 100 sccm, and pressure during the vapor-deposition was 6.5× $10^{-2}$ Pa. Further, a temperature of a coating roll for cooling the film during the vapor-deposition was adjusted at −10° C., thereby obtaining the laminate of the present invention. These thin-film formation conditions will be shown in Table 1.

A thin-film thickness and a ratio of Al and Si of the thus obtained laminate were measured by an X-ray fluorescence spectrometer, oxygen permeability was measured as the gas barrier properties, and light transmittance was measured as an optical property by using the produced laminate. Further, acid resistance was evaluated.

Comparative Example 1

A composite oxide thin-film was formed on a PET film (TOYOBO CO., LTD.: E5100) with a thickness of 12 μm by a vacuum vapor-deposition device shown in FIG. 1, using particulate Al (purity: 99.9%) of about 7 mm to about 9 mm and $SiO_2$ (purity: 99.9%) of about 4 mm to about 7 mm as vapor deposition sources. The above-described two kinds of the vapor-deposition materials were not mixed, but were partitioned by putting Al into a crucible which was made of $Al_2O_3$ and had holes and putting $SiO_2$ around the crucible in a hearth. One electron gun was used as a heat source so as to heat each of Al and $SiO_2$ by time division. An output of electron beams was 0.5 A, a heating ratio (time ratio) of Al and $SiO_2$ was 53:47, and feeding speed of the film was 50 m/min, thereby forming the composite thin-film with a thickness of 54.5 nm. A flow rate of oxygen gas was 150 sccm, and pressure during the vapor-deposition was 8.5× $10^{-2}$ Pa. Further, a temperature of a coating roll for cooling the film during the vapor-deposition was adjusted at −10° C., thereby obtaining the laminate of the present invention. These thin-film formation conditions will be shown in Table 1.

A thin-film thickness and a ratio of Al and Si of the thus obtained laminate were measured by an X-ray fluorescence spectrometer, oxygen permeability was measured as the gas barrier properties, and light transmittance was measured as the optical property by using the produced laminate. Further, acid resistance was evaluated.

Comparative Example 2

A composite oxide thin-film was formed on a PET film (TOYOBO CO., LTD.: E5100) with a thickness of 12 μm by a vacuum vapor-deposition device shown in FIG. 1, using particulate Al (purity: 99.9%) of about 7 mm to about 9 mm and $SiO_2$ (purity: 99.9%) of about 4 mm to about 7 mm as vapor deposition sources. The above-described two kinds of the vapor-deposition materials were not mixed, but were partitioned by putting Al into a crucible which was made of $Al_2O_3$ and had holes and putting $SiO_2$ around the crucible in a hearth. One electron gun was used as a heat source so as to heat each of Al and $SiO_2$ by time division. An output of electron beams was 0.4 A, a heating ratio (time ratio) of Al and $SiO_2$ was 60:40, and feeding speed of the film was 200 m/min, thereby forming the composite thin-film with a thickness of 18.9 nm. Oxygen gas was not introduced. Further, a temperature of a coating roll for cooling the film during the vapor-deposition was adjusted at −10° C., thereby obtaining the laminate of the present invention. These thin-film formation conditions will be shown in Table 1.

A thin-film thickness and a ratio of Al and Si of the thus obtained laminate were measured by an X-ray fluorescence spectrometer, oxygen permeability was measured as the gas barrier properties, and light transmittance was measured as the optical property by using the produced laminate. Further, acid resistance was evaluated.

TABLE 1

| | Thin-film formation speed (m/min) | Current value (A) | Oxygen flow rate (sccm) | Pressure (Pa) | Heating ratio a | Heating ratio b |
|---|---|---|---|---|---|---|
| Example 1 | 200 | 0.7 | 100 | 0.094 | 40 | 60 |
| Example 2 | 100 | 0.6 | 100 | 0.065 | 49 | 51 |
| Comparative Example 1 | 50 | 0.5 | 150 | 0.085 | 53 | 47 |
| Comparative Example 2 | 200 | 0.4 | 0 | 0.001 | 60 | 40 |

TABLE 2

| | Composition ratio Al % by mass | Composition ratio Si % by mass | Thin-film thickness (nm) | Ratio of Al content amount between before and after treatment (%) | Oxygen permeability (ml/m$^2$/24 H/MPa) | Total light transmittance (%) |
|---|---|---|---|---|---|---|
| Example 1 | 25 | 75 | 19.1 | 85.8 | 17.5 | 88 |
| Example 2 | 47 | 53 | 36.4 | 77.7 | 31.2 | 84 |
| Comparative Example 1 | 56 | 44 | 54.5 | 32.4 | 20.4 | 78 |
| Comparative Example 2 | 76 | 24 | 18.9 | 0.0 | 20.5 | 39 |

From Table 2, each of the laminates obtained in Examples 1 to 2 had the Al content rate after the acid immersion which was 75% or higher, and exhibited the acid resistance. Further, the oxygen permeability and total light transmittance of each of the laminates obtained in Examples 1 to 2 were also sufficient as the performances of the transparent gas barrier films. On the other hand, the laminate obtained in Comparative Example 1 had the heating ratio (time ratio) of Al and SiO$_2$ which satisfied a>b, whereby the Al content rate after the treatment by the aqueous solution of hydrochloric acid was decreased. The laminate obtained in Comparative Example 2 did not contain Al after the treatment by the aqueous solution of hydrochloric acid, because oxygen gas was not introduced therein, so that the total light transmittance was also low.

INDUSTRIAL APPLICABILITY

The present invention enables to produce a gas barrier laminated body having excellent gas barrier properties, acid resistance, and transparency at high speed, and the gas barrier laminated body can be used favorably as a packaging film which is used in a packaging field for food, pharmaceutical products, precise electronic components and the like, and particularly as a protective layer to be applied for refusing acid.

DESCRIPTION OF REFERENCE SIGNS

1 VACUUM CHAMBER
2 COOLING DRUM
3 UNWINDING PORTION
4 WINDING PORTION
5 GUIDE ROLL
6 BASE FILM
7 INORGANIC THIN-FILM LAYER LAMINATE
8 ELECTRON GUN
9 CRUCIBLE
10 VACUUM PUMP
11 REACTIVE GAS INTRODUCTION PIPE
12 REACTIVE GAS INTRODUCTION DIRECTION
13 ATTACHMENT PREVENTION PLATE

The invention claimed is:

1. A gas barrier laminated body, comprising a polymer substrate and an inorganic thin-film layer laminated onto at least one surface of the polymer substrate,
    wherein the inorganic thin-film layer contains Al and Si, and a ratio of an Al content amount in the inorganic thin-film layer between before and after treatment of immersing the laminate into aqueous solution of hydrochloric acid that has concentration of 1 mol/L for one hour, satisfies Formula 1:

(Al Content Amount After Treatment)/(Al Content Amount Before Treatment)×100≥75, and wherein the inorganic thin-film layer is a vapor-deposited thin-film layer that is made of composite oxide containing Al and Si.

* * * * *